(12) United States Patent
Seon

(10) Patent No.: US 10,559,434 B2
(45) Date of Patent: Feb. 11, 2020

(54) CONTROL CIRCUIT FOR ELECTRIC LEAKAGE CIRCUIT BREAKER

(71) Applicant: LSIS CO., LTD., Anyang-si, Gyeonggi-do (KR)

(72) Inventor: Jongkug Seon, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 322 days.

(21) Appl. No.: 15/499,789

(22) Filed: Apr. 27, 2017

(65) Prior Publication Data

US 2017/0316896 A1 Nov. 2, 2017

(30) Foreign Application Priority Data

Apr. 28, 2016 (KR) ........................ 10-2016-0052316

(51) Int. Cl.
*H02H 3/16* (2006.01)
*H01H 9/54* (2006.01)
(Continued)

(52) U.S. Cl.
CPC ............ *H01H 9/54* (2013.01); *H01H 71/123* (2013.01); *H01H 83/02* (2013.01); *H02H 3/33* (2013.01);
(Continued)

(58) Field of Classification Search
USPC ..................................................... 361/42–50
See application file for complete search history.

(56) References Cited

U.S. PATENT DOCUMENTS 4,150,411 A * 4/1979 Howell .................. H02H 3/331
361/113
4,639,684 A 1/1987 Laude
(Continued)

FOREIGN PATENT DOCUMENTS

CN 1518181 A 8/2004
CN 101755371 A 6/2010
(Continued)

OTHER PUBLICATIONS

Korean Intellectual Property Office Search report dated Apr. 22, 2016, 4 pages.
(Continued)

*Primary Examiner* — Danny Nguyen
(74) *Attorney, Agent, or Firm* — K&L Gates LLP

(57) ABSTRACT

A control circuit for an electric leakage circuit breaker, capable of preventing an error in determining an electric leakage generation due to an offset voltage of an input amplifier, including, a zero phase current transformer configured to detect a zero phase current on a circuit as a leakage detection signal, a filter circuit section configured to remove a high frequency noise included in the leakage detection signal, an input amplifier configured to a voltage formed by a current of the leakage detection signal and an impedance of the filter circuit section, and includes a pair of transistors, a base current generator commonly connected to the bases of the pair of transistors and configured to supply the same amount of base current to the pair of transistors, and a trip determination circuit section configured to determine whether to output a trip control signal.

7 Claims, 3 Drawing Sheets

(51) Int. Cl.
*H02H 3/33* (2006.01)
*H01H 83/02* (2006.01)
*H01H 71/12* (2006.01)
*H03F 3/45* (2006.01)
*H02H 7/04* (2006.01)
*H02H 3/10* (2006.01)

(52) U.S. Cl.
CPC .............. *H02H 3/105* (2013.01); *H02H 3/16* (2013.01); *H02H 7/04* (2013.01); *H03F 3/456* (2013.01)

(56) References Cited

U.S. PATENT DOCUMENTS

| | | | |
|---|---|---|---|
| 6,255,887 B1* | 7/2001 | Adams | G05F 3/262 |
| | | | 323/315 |
| 6,636,111 B1 | 10/2003 | Gross et al. | |
| 7,271,444 B2* | 9/2007 | Furukawa | H01L 29/42384 |
| | | | 257/347 |
| 2011/0234322 A1 | 9/2011 | Bowers | |

FOREIGN PATENT DOCUMENTS

| | | |
|---|---|---|
| CN | 101924342 A | 12/2010 |
| CN | 105259460 A | 1/2016 |
| EP | 1518310 | 3/2005 |
| EP | 2254216 | 11/2010 |
| JP | 06-196945 | 7/1994 |
| JP | 2001007685 | 1/2001 |
| JP | 2010183721 | 8/2010 |
| JP | 2010272523 A | 12/2010 |
| JP | 2014207644 | 10/2014 |
| KR | 1020060071692 | 6/2006 |
| KR | 101466851 | 11/2014 |
| WO | 2004001924 | 12/2003 |

OTHER PUBLICATIONS

Chinese Office Action for related Chinese Application No. 201710296126.1; action dated Mar. 30, 2018; (6 pages).

Japanese Office Action for related Japanese Application No. 2017-090346; action dated Oct. 23, 2018; (3 pages).

European Patent Office Application Serial No. 17167888.1, Search Report dated Aug. 11, 2017, 9 pages.

* cited by examiner

CONTROL CIRCUIT FOR ELECTRIC LEAKAGE CIRCUIT BREAKER

CROSS-REFERENCE TO RELATED APPLICATION

Pursuant to 35 U.S.C. § 119(a), this application claims the benefit of earlier filing date and right of priority to Korean Application No. 10-2016-0052316, filed on Apr. 28, 2016, the contents of which are all hereby incorporated by reference herein in its entirety.

BACKGROUND OF THE INVENTION

1. Field of the Invention

The present invention relates to an electric leakage circuit breaker, more particularly, to a control circuit for an electric leakage circuit breaker having an amplification circuit that can amplifies a leakage detection voltage input of a zero phase current transformer.

2. Description of the Conventional Art

In general, a circuit breaker is an electric switch that protects a circuit and loads connected to the circuit from a fault circuit, by automatically breaking (tripping) the circuit when a fault current such as an over-current or a short-circuit on the circuit occurs.

An electric leakage circuit breaker is an electric switch additionally having an element which is configured to break a circuit when an electric leakage that an electric current flows to a ground without flowing to a load side, though in part, is generated.

The present invention relates to such an electric leakage circuit breaker, and particularly to a control circuit that determines whether to start a trip operation by detecting an electric leakage when the electric leakage is generated in a circuit.

FIG. 1 is a schematic view illustrating a circuit configuration of a conventional electric leakage circuit breaker.

A control circuit of an electric leakage circuit breaker (hereinafter, referred to as a control circuit) 100 includes a zero phase current transformer 10, a filter circuit section 20, an input amplifier 30, and a trip determination circuit section 40.

The zero phase current transformer 10 includes a ring shaped core through which a circuit passes, and a secondary coil, wound around the core, that outputs a zero phase current (IL) as an electric leakage detection signal induced when an electric leakage is generated from a circuit.

The filter circuit section 20 is connected to the second coil and configured to remove a noise from the zero phase current (IL).

The input amplifier 30 is connected between the filter circuit section 20 and the trip determination circuit section 40.

The input amplified 30 can be configured with a typical operational amplifier.

The zero phase current (IL) that has flown the filter circuit section 20 is supplied as a base current (Ib) of a pair of transistors Q1 and Q2.

The base current (Ib) supplied to the input amplifier 30 is amplified as much as the ratio between the base current (Ib) and a collector current (Ic).

An output of the input amplifier 30 is supplied to the trip determination circuit section 40 as a voltage by collector resistors connected to collectors of the pair of transistors Q1 and Q2.

The trip determination amplifier 40 compares a preset reference voltage value for determining a trip operation and an output voltage value of the input amplifier as an amplified leakage detection signal, determines to execute a trip operation when the output voltage value is not less than the reference voltage value, and outputs a trip control signal.

The trip control signal is transmitted to a trip mechanism 50 such as a well-known magnetic trip mechanism (not shown).

The trip mechanism 50 may be provided with for instance a coil (not shown) and an output unit such as an armature or a plunger. The coil is magnetized by the trip control signal, and moves the output unit by a magnetic force of the coil to trigger a switching mechanism (not shown) to automatically break a circuit, that is, to execute a trip operation.

As a result, the switching mechanism actuates a movable contact to separate from a fixed contact so that a circuit breaking operation can be performed, when an electric leakage is generated.

The input amplifier 30 may be provided with an operational amplifier, as shown in FIG. 1.

A circuit of the operational amplifier 30 may be provided with a pair of transistors, two constant current sources connected to collectors of the pair of transistors, and a single constant current source commonly connected to emitters of the pair of transistors.

Meanwhile, in the conventional electric leakage circuit breaker, leakage current (IL) which has flown through the filter circuit section 20 is inputted to an input amplifier 30 and used as a base current (Ib) of the pair of transistors Q1 and Q2 of the input amplifier 30, and remaining current, i.e., IL−(2×Ib) is transferred to the zero phase transformer 10.

A voltage drop is generated by the remaining current and impedance (Z) of the filter circuit section 20, and the voltage drop may be generated as the following equation.

$$Vd=(IL-2Ib)\times Z \quad \text{(Equation 1)}$$

That is, only a voltage conversion value of the leakage current (IL) which is obtained by multiplying the leakage current (IL) by the impedance (Z) of the filter has to be amplified by the input amplifier, but an error of voltage conversion value (hereinafter, referred to as an offset voltage) of the leakage current (IL) as much as the value of multiplication of an amplification degree of the input amplifier by $2Ib\times Z$, as shown in the above equation, is generated.

Such an error may cause an erroneous operation in determination of the trip determination circuit section at the next stage.

SUMMARY OF THE INVENTION

An object of the present invention is to provide a control circuit for an electric leakage circuit breaker, capable of correctly determining a leakage generation by preventing an occurrence of error (offset voltage) when amplifying a leakage detection signal.

To achieve these and other advantages and in accordance with the purpose of this specification, as embodied and broadly described herein, there is provided a control circuit for an electric leakage circuit breaker, comprising: a zero phase current transformer configured to detect a zero phase current on a circuit as a leakage detection signal; a filter circuit section configured to remove a high frequency noise included in the leakage detection signal; an input amplifier configured to amplify a voltage formed by a current of the leakage detection signal and an impedance of the filter circuit section, and includes a pair of transistors, bases of the transistors connected to both output terminals of the filter circuit section, respectively; a base current generator commonly connected to the bases of the pair of transistors and configured to supply the same amount of base current to the pair of transistors; and a trip determination circuit section configured to determine whether to output a trip control signal by comparing a voltage value of an amplified leakage detection signal outputted from the input amplifier with a preset reference voltage value.

According to a preferred aspect of this invention, the base current generator comprises a current mirror circuit.

According to another preferred aspect of this invention, the current mirror circuit comprises a Bipolar Junction Transistor (BJT) mirror circuit.

According to still another preferred aspect of this invention, the current mirror circuit may include a Metal Oxide Semiconductor Field Effect Transistor (MOSFET) mirror circuit.

According to still another preferred aspect of this invention, the current mirror circuit may include a first BJT through which a reference current flows, a second BJT, having a base connected to the base of the first BJT, configured to supply an output current of the same current value as the reference current, and a third BJT, having a base connected to the base of the first BJT, configured to supply an output current of the same current value as the reference current.

According to still another preferred aspect of this invention, the first, second and third BJT may have the same electrical characteristics.

According to still another preferred aspect of this invention, the control circuit for an electric leakage circuit breaker according to this disclosure further comprises the a gain adjuster, connected to the base current generator, configured to adjust the gain of a collector current of the pair of transistors over the base current by adjusting the base current supplied to the base of the pair of transistors.

According to still another preferred aspect of this invention, the gain adjuster comprises a constant voltage source and a variable resistor connected in series to a corresponding constant voltage source and configured to adjust the base current by adjusting the resistance of the variable resistor.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIGS. 3A and 3B are circuit diagrams of a base current generator of FIG. 2, in which FIG. 3A shows an example in which a transistor is used as an active element, and FIG. 3B shows an example in which a MOSFET transistor is used as an active element;

DETAILED DESCRIPTION OF THE PREFERRED EMBODIMENT

Hereinafter, a preferred embodiment of a control circuit for an electric leakage circuit breaker in accordance with a preferred embodiment of the present invention will now be described in detail with reference to the accompanying drawings.

Figure 1:
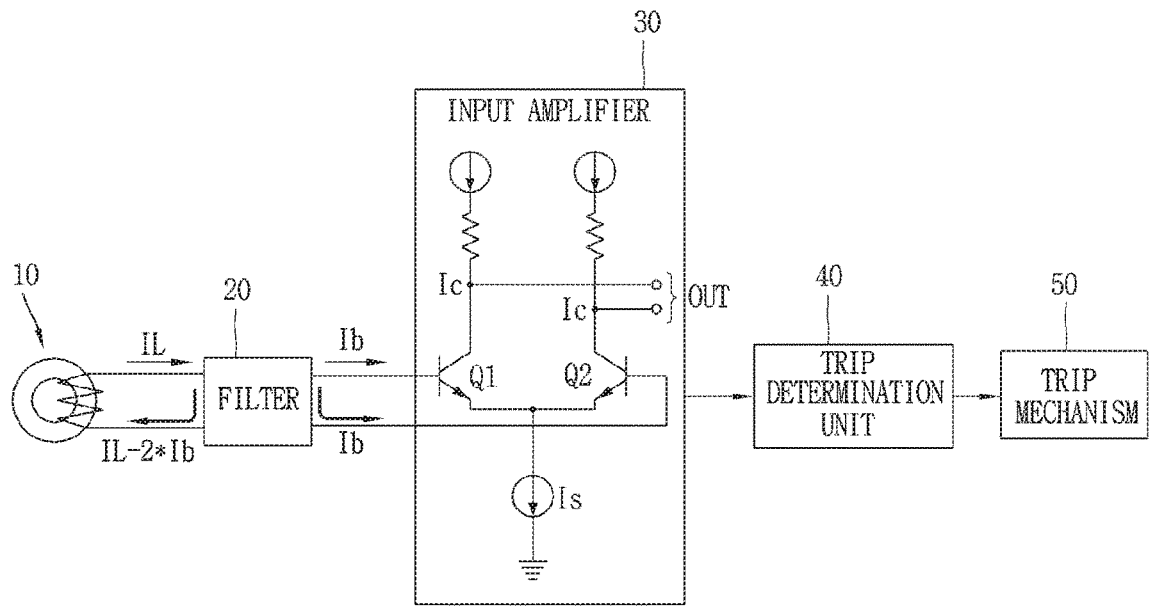
FIG. 1 is a block diagram illustrating a control circuit for an electric leakage circuit breaker in accordance with the conventional art.
Figure 2:
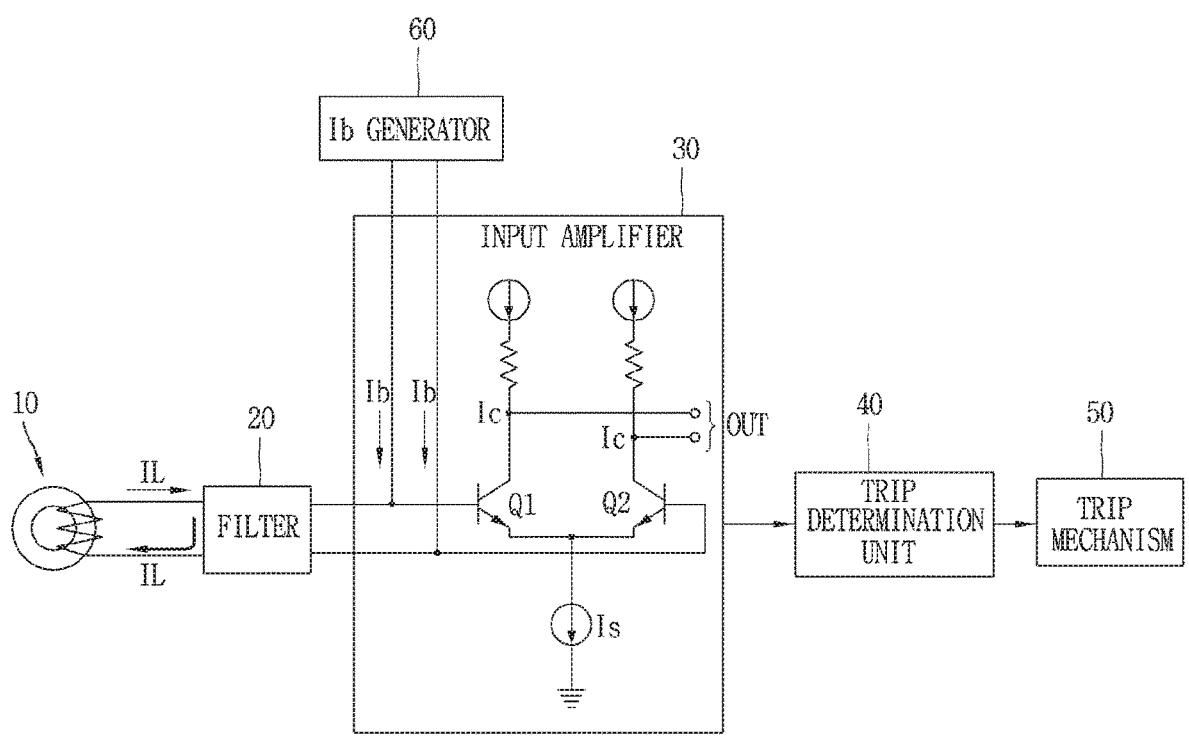
FIG. 2 is a block diagram illustrating a control circuit for an electric leakage circuit breaker in accordance with a preferred embodiment of the present invention.

As shown in FIG. 2, the control circuit for an electric leakage circuit breaker in accordance with a preferred embodiment of the present invention comprises a zero phase current transformer (ZCT) 10, a filter circuit section 20, an input amplifier 30, a base current generator 60, and a trip determination circuit section 40.

In FIG. 2, the trip mechanism is, as well known, a mechanism including a magnetic coil and a mechanical output unit such as an armature which is configured to rotate or a plunger which is configured to linearly move by a magnetic force when the magnetic coil is magnetized, and operated by the control circuit according to the present invention.

The mechanical output of the corresponding trip mechanism is configured to trigger the switching mechanism including a trip spring, a latch, and a link and so on to trip.

The ZCT 10 is configured to detect a zero phase current (IL) as a leakage detection signal which is generated when an electric leakage occurs on a circuit.

The ZCT 10 comprises a ring-shaped core through which a circuit passes, and a secondary coil wound around the core and configured to output an induced zero phase current (IL).

The filter circuit section 20 can be configured with a well-known low pass filter circuit section to remove a high frequency noise included in the electric leakage detection signal.

Unlike the conventional control circuit in which a current outputted from the filter circuit section 20 is used as a base current (Ib) of the input amplifier 30, according to the present invention, the zero phase current (IL) is transferred again to the zero phase transformer 10.

In the present invention, assuming that an impedance of the filter circuit section 20 is Z, a voltage drop by the impedance Z of the filter circuit section 20 and the zero phase current (IL) from which a high frequency component is removed, that is, IL×Z is amplified by the input amplifier 30.

That is, in the present invention, only voltage conversion value of the electric leakage signal by the zero phase current (IL) and the impedance (Z) of the filter circuit section 20 is amplified by the input amplifier 30 without any error by an offset voltage, a correct leakage determination can be made at a next stage such as a trip determination circuit section.

The input amplifier 30 amplifies a voltage formed by a current of the leakage detection signal (in other words the zero phase current) and the impedance (Z) of the filter circuit section 20.

The input amplifier 30 can be configured with a typical operational amplifier.

The input amplifier 30 comprises a pair of transistors Q1 and Q2 having each base which is connected to both output terminals of the filter circuit section, respectively.

The input amplifier 30 may be configured to further include constant current sources which supply a constant current to collectors of the pair of transistors Q1 and Q2, and a constant current source which commonly supplies a constant current to emitters of the pair of transistors Q1 and Q2.

The base current generator 60 is commonly connected to bases of the pair of transistors Q1 and Q2, and supplies the same amount of base current to the pair of transistors Q1 and Q2.

Figure 3A:
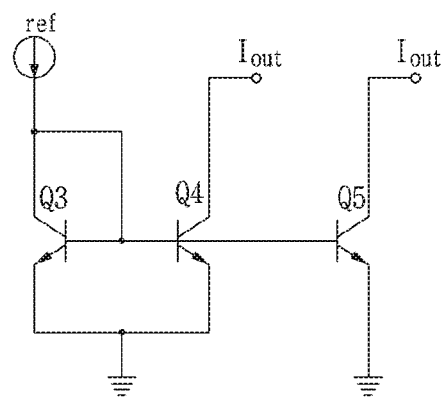
Figure 3B:
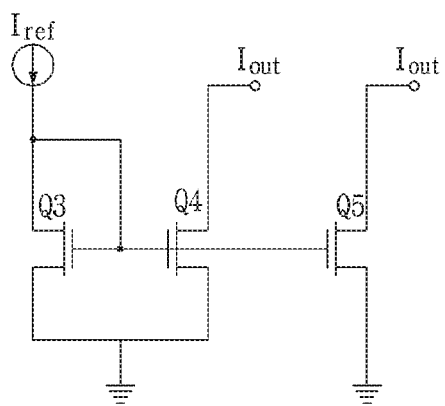

The base current generator 60 can be configured with a current mirror circuit, as shown in FIGS. 3A and 3B.

Particularly, the base current generator 60 may be provided with a Bipolar Junction Transistor (abbreviated as BJT hereinafter) current mirror circuit, as shown in FIG. 3A.

Here, the BJT current mirror circuit comprises a BJT3 (Q3), a BJT4 (Q4) and a BJT5 (Q5) each having bases connected to each other, as shown in FIG. 3A.

The BJT mirror circuit further comprises a constant current source which supplies a reference current (Iref).

The reference current (Iref) is supplied to the collector and base of the BJT3 (Q3), and current output terminals are connected to the collectors of the BJT4 (Q4) and BJT5 (Q5), respectively.

The reference current (Iref) flows through the BJT3 (Q3). More specifically, the reference current (Iref) is supplied to the collector and base of the BJT3 (Q3).

The BJT4 (Q4) has a base connected to the base of the BJT3 (Q3), and configured to supply an output current having the same current value as the reference current (Iref), i.e., a collector current (Ic).

The BJT5 (Q5) comprises a base connected to the base of the BJT4 (Q4), and configured to supply an output current having the same current value as the reference current (Iref), i.e., a collector current (Ic).

Emitters of the BJT3 (Q3), BJT4 (Q4) and BJT4 (Q5) are grounded.

The BJT3 (Q3), BJT4 (Q4) and BJT4 (Q5) are configured by BJTs having the same electric characteristics.

The BJT mirror circuit, as shown in FIG. 3A, outputs an output current (Iout) having the same current value as the reference current (Iref) through the current output terminal connected to the collectors of the BJT4 (Q4) and BJT5 (Q5).

Further, according to another embodiment of the present invention, as shown in FIG. 3B, the current mirror circuit may be configured by a Metal Oxide Semiconductor Field Effect Transistor (MOSFET) mirror circuit.

This embodiment of the present invention is different from the previous embodiment in which the BJT is used as an active element, as shown in FIG. 3A, in that MOSFET is used as an active element.

Thus, the detailed description and operation of this embodiment will be omitted for avoiding redundant description, as those are the same as the previous description in reference with FIG. 3A.

Meanwhile, in FIG. 2, the trip determination circuit section 40 is configured to determine whether to output a trip control signal by comparing a voltage value of an amplified leakage detection signal outputted from the input amplifier 30 with a preset reference voltage value.

Meanwhile, referring to FIG. 2, the operation of the control circuit of the electric leakage circuit breaker according to the present invention will be described briefly.

The ZCT 10 is configured to detect the zero phase current (IL) as an electric leakage signal which is generated when an electric leakage occurs on a circuit.

The filter circuit section 20 is configured to remove a high frequency noise included in the current leakage detection signal, that is, the zero phase current (IL). Further, the filter circuit section 20 supplies a voltage according to an impedance of the filter circuit 20, that is, IL×Z as an input voltage to the input amplifier 30.

In this instance, unlike the conventional control circuit in which the zero phase current outputted from the filter circuit section 20 is used as a base current of the transistors, the base current generator 60 according to the present invention supplies base currents (Ibs) of the same amount to the bases of the pair of transistors (Q1 and Q2) of the input amplifier 30.

At this time, the zero phase current (IL) is fed back to the ZCT 10.

According to the present invention, the zero phase current (IL) as a leakage detection signal is converted into an input voltage by the impedance (Z) of the filter circuit section 20, and the leakage detection signal before amplification becomes the input voltage formed at the filter circuit section 20.

The input voltage of IL×Z as the leakage detection signal which is formed at the filter circuit section 20 is amplified by the input amplifier 30 at the ratio of the collector current (Ic) over the base current (Ib).

The collector current (Ic) can be outputted through the output terminals connected to the collectors of the transistors (Q1 and Q2) after being converted into a voltage by the collector resistors.

That is, the voltage of the output terminals connected to the collectors of the transistors (Q1 and Q2), as shown in FIG. 2, is supplied to the trip determination circuit section 40 as an amplified voltage signal of the leakage detection signal outputted from the input amplifier 30.

The trip determination circuit section 40 is configured to determine whether to output a trip control signal by comparing a voltage value of an amplified leakage detection signal which is outputted from the input amplifier 30 with a preset reference voltage value.

For instance, when the voltage value of the amplified leakage detection signal is the same as or larger than the preset reference voltage, the trip determination circuit section 40 generates and outputs a trip control signal to a trip mechanism 50 at the next stage.

The trip mechanism 50 can be configured to comprise a coil (not shown) and an output unit such as an armature or a plunger. The coil is magnetized by the trip control signal, and the output unit is moved by a magnetic force of the coil to trigger so that the switching mechanism (not shown) may execute an automatic circuit breaking operation, that is, a trip operation.

As a result, the switching mechanism actuates a movable contact so as to be separated from a corresponding fixed contact (not shown) so that a circuit breaking operation can be completed when an electric leakage occurs.

Figure 4:
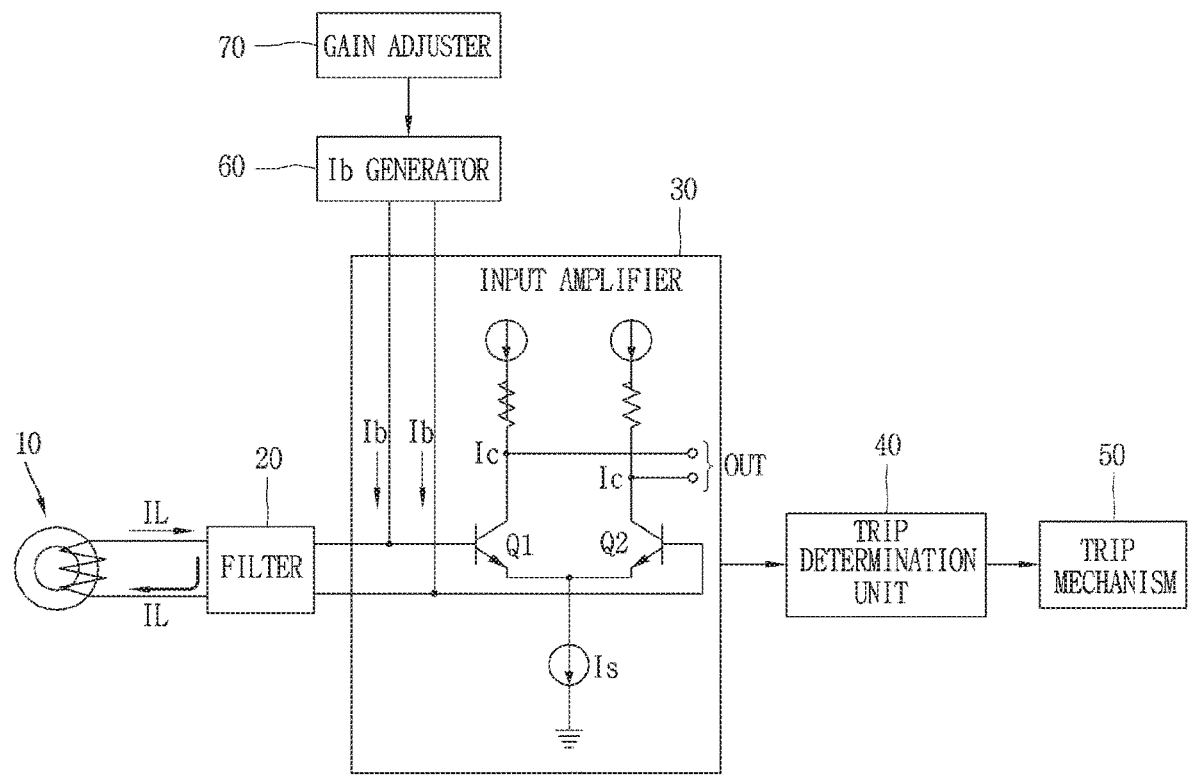
FIG. 4 is a block diagram illustrating a control circuit for an electric leakage circuit breaker in accordance with another preferred embodiment of the present invention.

Meanwhile, a control circuit for an electric leakage circuit breaker according to another preferred embodiment will be described with reference to FIGS. 4 and 5.

The control circuit for an electric leakage circuit breaker according to another preferred embodiment is different from that of the present invention as shown in FIG. 2 in that it further comprises a gain adjuster 70.

Thus, to avoid duplicated description, description will be made only on the gain adjuster 70, with reference to FIGS. 4 and 5.

The gain adjuster 70 is connected to the base current generator 60, and is configured to adjust a gain of a pair of transistors (Q1 and Q2) over the base current (Ib) by adjusting the base current (Ic) supplied to bases of the pair of transistors (Q1 and Q2) of the base current generator 60.

Figure 5:
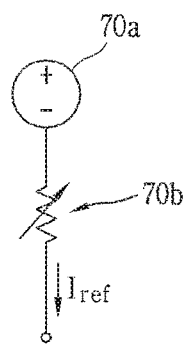
FIG. 5 is a circuit diagram showing the configuration according to a preferred embodiment of a gain controller of FIG. 4.

As can be seen in FIG. 5, the gain adjuster 70 may be configured to include a constant voltage source 70a and a variable resistor 70b connected in series to the constant voltage source 70a.

Thus, an output current which flows through the variable resistor 70b may be varied by manually adjusting the resistance of the variable resistor 70b with respect to the constant voltage supplied by the constant voltage source 70a.

Here, the output current of the gain adjuster 70 is supplied to the base current generator 60 as a reference current (Iref).

The reference current (Iref) which is an output current of the gain adjuster 70 may be adjusted by adjusting the resistance of the variable resistor 70b, and thus it is possible to adjust two base currents (Ib) which have the same current value as the output current of the base current generator 60 including a current mirror circuit.

Meanwhile, the relations between the collector current (Ic) and the base current (Ib) of the input amplifier 30 may be expressed as below equation (2).

$$Ic = \beta \times Ib \qquad \text{Equation (2),}$$

Here, ß represents an amplification ratio.

When the amplification ratio ß is constant, as shown in the equation (2), the collector current (Ic) is increased, the base current (Ib) is increased, and when the collector current (Ic) is decreased, the base current (Ib) is decreased.

Thus, it is possible to adjust a gain, that is, the degree that the collector current (Ic) is varied by adjusting the magnitude of the base current (Ib).

Further, the collector current (Ic) is transformed to a voltage by the resistor (refer to the resistors connected to the collectors in FIGS. 2 and 4), and supplied to the trip determination circuit section 40 as an output signal of the input amplifier 30.

As described above in detail, the control circuit according to the present invention comprises a base current generator which supplies a base current of a pair of transistors without using the detected zero phase current as a base current of a pair of transistors constituting an input amplifier, unlike the conventional control circuit, so that an offset voltage, that is a voltage drop which is generated by a difference between the zero phase current and the base current of the two transistors may not occur. Accordingly, since an offset voltage is not included in a leakage detection signal which is amplified by an input amplifier, it is possible to provide a control circuit of an electric leakage circuit breaker, which can precisely detect an electric leakage.

Further, according to the control circuit of the current leakage circuit breaker, it is possible to adjust a collector current of the pair of transistors, that is, an output current change (gain) and an output voltage change (gain) by adjusting a base current of the pair of transistors of the input amplifier through the gain adjuster, and such a characteristics can provide the effect to easily adjust a level (a voltage level) of a leakage detection signal as an input signal of the trip determination circuit.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A control circuit for an electric leakage circuit breaker, comprising:
   a zero phase current transformer configured to detect a zero phase current on a circuit as a leakage detection signal;
   a filter circuit section configured to remove a high frequency noise included in the leakage detection signal;
   an input amplifier configured to amplify a voltage formed by a current of the leakage detection signal and an impedance of the filter circuit section, and including a pair of transistors, bases of the transistors connected to both output terminals of the filter circuit section, respectively;
   a base current generator commonly connected to the bases of the pair of transistors and configured to supply the same amount of base current to the pair of transistors;
   a trip determination circuit section configured to determine whether to output a trip control signal by comparing a voltage value of an amplified leakage detection signal outputted from the input amplifier with a preset reference voltage value, and
   a gain adjuster, connected to the base current generator, configured to adjust the gain of a collector current of the pair of transistors over the base current by adjusting the base current supplied to the bases of the pair of transistors.

2. The control circuit of claim 1, wherein the base current generator comprises a current mirror circuit.

3. The control circuit of claim 2, wherein the current mirror circuit comprises a Bipolar Junction Transistor (BJT) mirror circuit.

4. The control circuit of claim 2, wherein the current mirror circuit comprises a Metal Oxide Semiconductor Field Effect Transistor (MOSFET) mirror circuit.

5. The control circuit of claim 2, wherein the current mirror circuit comprises:
   a first BJT through which a reference current flows;
   a second BJT, having a base connected to the base of the first BJT, configured to supply an output current of the same current value as the reference current; and
   a third BJT, having a base connected to the base of the first BJT, configured to supply an output current of the same current value as the reference current.

6. The control circuit of claim 5, wherein the first, second and third BJT have the same electrical characteristics.

7. The control circuit of claim 1, wherein the gain adjuster comprises a constant voltage source and a variable resistor connected in series to a corresponding constant voltage source and configured to adjust the base current by adjusting the resistance of the variable resistor.

* * * * *